(12) United States Patent
Doyle et al.

(10) Patent No.: US 11,139,401 B2
(45) Date of Patent: Oct. 5, 2021

(54) VERTICAL THIN FILM TRANSISTOR STRUCTURES WITH LOCALIZED GATE DIELECTRIC

(71) Applicant: Intel Corporation, Santa Clara, CA (US)

(72) Inventors: Brian Doyle, Portland, OR (US); Rami Hourani, Portland, OR (US); Elijah Karpov, Portland, OR (US); Prashant Majhi, San Jose, CA (US); Ravi Pillarisetty, Portland, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 16/435,359

(22) Filed: Jun. 7, 2019

(65) Prior Publication Data
US 2020/0388711 A1 Dec. 10, 2020

(51) Int. Cl.
| | |
|---|---|
| *H01L 29/786* | (2006.01) |
| *H01L 29/66* | (2006.01) |
| *H01L 27/11585* | (2017.01) |
| *H01L 29/51* | (2006.01) |
| *H01L 27/092* | (2006.01) |
| *H01L 29/78* | (2006.01) |

(52) U.S. Cl.
CPC ...... *H01L 29/78642* (2013.01); *H01L 27/092* (2013.01); *H01L 27/11585* (2013.01); *H01L 29/516* (2013.01); *H01L 29/66742* (2013.01); *H01L 29/78391* (2014.09)

(58) Field of Classification Search
CPC ......... H01L 29/78642; H01L 29/78645; H01L 29/78648; H01L 29/516; H01L 27/11585; H01L 27/092
See application file for complete search history.

(56) References Cited

U.S. PATENT DOCUMENTS

| | | | |
|---|---|---|---|
| 2017/0358598 A1* | 12/2017 | Bedeschi | .......... H01L 27/11582 |
| 2020/0357814 A1* | 11/2020 | Kim | ................. H01L 27/11558 |

* cited by examiner

*Primary Examiner* — Quoc D Hoang
(74) *Attorney, Agent, or Firm* — Green, Howard & Mughal LLP

(57) ABSTRACT

Transistor structures with a deposited channel semiconductor material may have a vertical structure that includes a gate dielectric material that is localized to a sidewall of a gate electrode material layer. With localized gate dielectric material threshold voltage variation across a plurality of vertical transistor structures, such as a NAND flash memory string, may be reduced. A via may be formed through a material stack, exposing a sidewall of the gate electrode material layer and sidewalls of the dielectric material layers. A sidewall of the gate electrode material layer may be recessed selectively from the sidewalls of the dielectric material layers. A gate dielectric material, such as a ferroelectric material, may be selectively deposited upon the recessed gate electrode material layer, for example at least partially backfilling the recess. A semiconductor material may be deposited on sidewalls of the dielectric material layers and on the localized gate dielectric material.

17 Claims, 10 Drawing Sheets

VERTICAL THIN FILM TRANSISTOR STRUCTURES WITH LOCALIZED GATE DIELECTRIC

BACKGROUND

Demand for integrated circuits (ICs) in portable electronic applications has motivated greater levels of semiconductor device integration. Many advanced semiconductor devices in development leverage semiconductor materials deposited as a thin film layer for at least the transistor channel Such thin film transistors (TFTs) may advantageously rely on thin film deposition of semiconductor transistor channel material. TFTs may also be fabricated into a wide variety of structures, such as vertical channeled devices. Vertical NAND flash memory architectures, for example, have been found to offer memory array density advantages over planar NAND flash memory architectures.

However, many vertical transistor device architectures have lateral scaling issues as a number of thin film material layers, each having some finite minimum thickness, may need to be deposited on feature sidewalls to form a given structure. As a result, the footprint of a vertical transistor device can be difficult to reduce below 20 nm, and/or device variation resulting from a buildup of blanket deposited material layers can become limiting.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
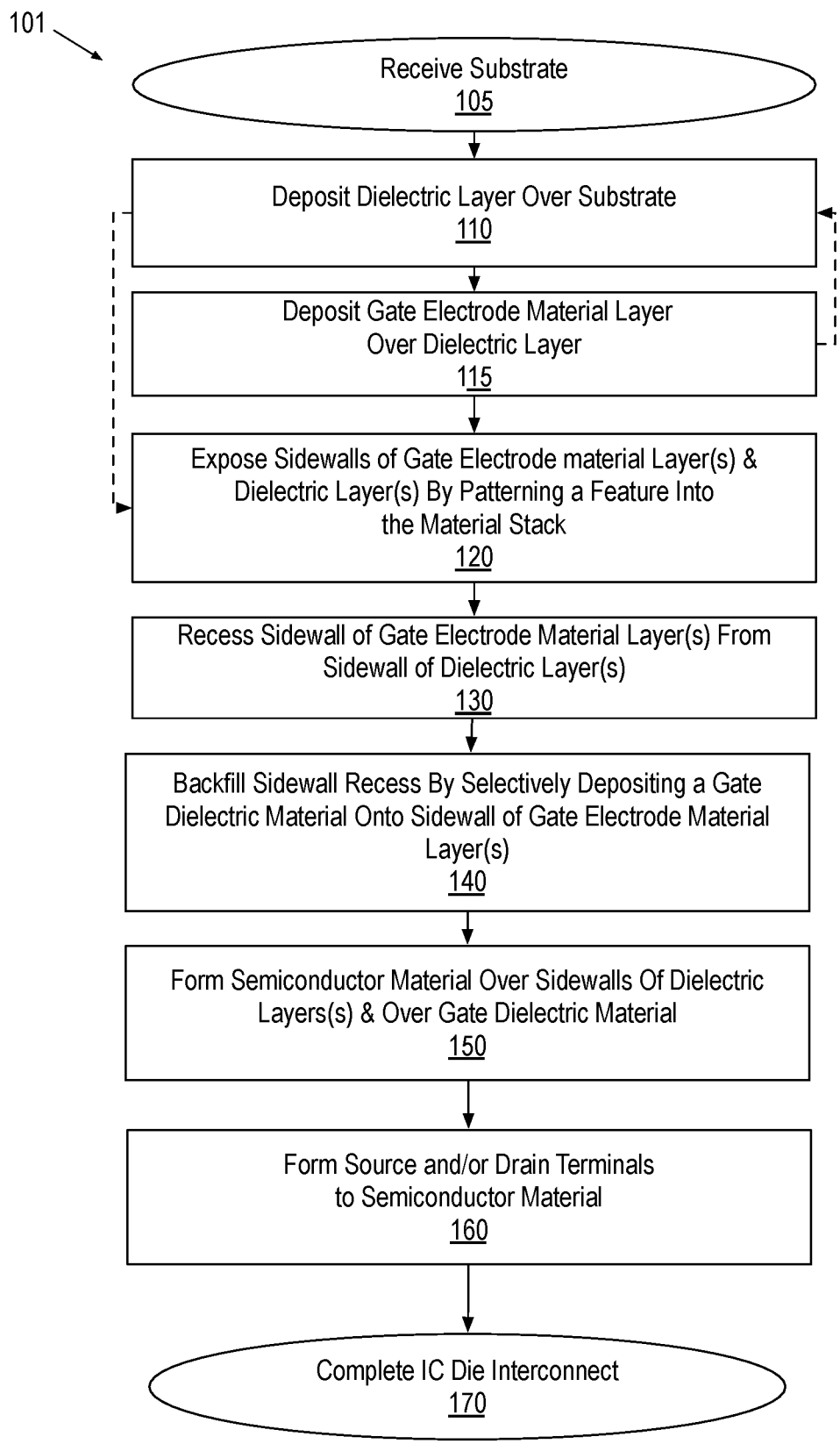
FIG. 1 is a flow diagram illustrating methods of fabricating vertical thin film transistor structures, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor structures including a vertically oriented semiconductor channel material with localized gate dielectrics, and methods of fabricating such structures. The vertical semiconductor channel material may be deposited as the thin film, for example. While the vertical channel architectures described herein are interesting for logic applications, they may be particularly advantageous in the context of memory devices. In contrast to logic devices, memory devices have at least two stable states, and if non-volatile, these stable states can be retained even in the absence of the application of power.

In some embodiments described further below, an additive nanopatterning technique localizes gate dielectric material to a channel portion of a vertical transistor structure. In some exemplary Fe (ferroelectric) FET (field effect transistor) embodiments, the localized gate dielectric material has a permanent dipole. As a result, the threshold voltage ($V_t$) of an FeFET can vary between multiple states (e.g., $V_{t,high}$ and $V_{t,low}$) as a function of the dipole state of the gate dielectric. A bit value may be assigned to a particular one of the threshold voltage levels, and read out accordingly. In some further embodiments described below, a vertical Fe-NAND flash memory device structure may include localized gate dielectric material that may reduce the footprint of a vertical Fe-FET structure, and therefore reduce the footprint of a vertical Fe-NAND flash memory cell string.

The inventors have found that the thickness of the semiconductor channel material needs to be well controlled for a vertical thin film transistor structure to have a well-controlled $V_t$. This is particularly true for a vertical Fe-FET where the threshold voltage is split into multiple levels, and control of these levels is important for usable bit levels. Being vertically oriented, the semiconductor channel material thickness control is more challenging as the material is not merely deposited over a flat substrate surface, but is instead deposited over a sidewall of a topographic feature. Because it becomes more difficult to maintain control of the semiconductor channel material thickness as feature aspect ratios and/or sidewall undulations increase, excessive $V_t$ variation may limit dimensional scaling of vertical channeled thin film transistor structures, particularly vertical Fe-NAND flash memory device structures with their tighter $V_t$ control requirements. In accordance with embodiments herein, an additive nanopatterning technique is employed to localize the gate dielectric material, which may reduce aspect ratios and/or semiconductor material thickness variation. $V_t$ variation may therefore be improved in vertical thin film transistor structures of a given dimension. Similarly, a smaller device dimension may also achieve a given level of $V_t$ variation.

FIG. 1 is a flow diagram illustrating fabrication methods 101, in accordance with some exemplary embodiments where a gate dielectric material is selectively formed only where the material is functionally useful to the transistor (e.g., between a gate electrode material and a channel semiconductor material). With the gate dielectric material localized, structural features of the transistor that are adjacent to the gate electrode may be spared a build up of gate dielectric material. By avoiding such material build up, feature dimensions and/or material thicknesses may be better maintained throughout the fabrication process. Aspect ratios of a vertical transistor structure can then be kept from becoming more extreme during processing performed prior to the deposition of a semiconductor material that is to be a channel of the transistor structure, for example.

Methods 101 begin with receiving a substrate at block 105. The substrate received may be any substrate suitable for IC device manufacture. In some embodiments, the substrate advantageously includes a monocrystalline semiconductor layer, such as a silicon layer. In some further embodiments, the substrate includes a monocrystalline semiconductor layer in which front-end-of-line (FEOL) FETs may have been fabricated, for example upstream of methods 101. In some embodiments, the substrate received includes FEOL FETs of any architecture that are interconnected with one or more metallization levels to form FEOL circuitry. In some examples, the FEOL FETs include both n-type and p-type FETs interconnected into a CMOS FEOL circuit. In some exemplary embodiments, the uppermost (working) surface of the substrate is substantially planar, or flat. In other embodiments however, there may be some topographic features in the uppermost surface of the substrate. In alternative embodiments where no FEOL circuitry is present, the substrate received at block 105 may been any material (e.g., polymer, glass, etc.).

Methods 101 continue with forming a material stack over the substrate. The material stack includes at least one gate electrode material layer, and may advantageously include a plurality of gate electrode material layers. The material stack further includes dielectric material layers suitable for electrically insulating the gate electrode material layer from other gate electrode material layers and/or other underlying or overlying interconnect metallization levels. In the illustrated example, a dielectric material layer is deposited at block 110. The dielectric material layer may have any composition suitable as an interlayer dielectric (ILD) to electrically insulate a gate electrode material layer from any underlying substrate structures. Examples of suitable dielectric materials include, but are not limited to, silicon dioxide, silicon nitride, silicon oxynitride, a low-k material, a dielectric metal oxide, or a laminate structure comprising two or more of these dielectric materials. Any deposition technique known to be suitable for the particular dielectric composition may be employed at block 110. In some examples, chemical vapor deposition (CVD), plasma enhanced CVD (PECVD), atomic layer deposition (ALD), or flowable dielectric deposition techniques are practiced to blanket deposit a dielectric material layer to a layer thickness of ten to hundreds of nanometers, for example. In some embodiments, the dielectric material layer is deposited to a thickness of 20-50 nm. However, dielectric material layer thickness may be above or below this exemplary range.

At block 115, a gate electrode material is deposited, for example using any blanket thin film deposition technique suitable for the desired gate electrode material composition. In some embodiments, a metallic material (e.g., comprising a metal) is deposited at block 115. Physical vapor deposition (PVD), molecular beam deposition (MBD), metal-organic CVD (MOCVD), or ALD techniques may be employed, for example, to deposit layer of substantially pure elemental metal, a metal alloy, or a metallic compound. The gate electrode material may be deposited to film thicknesses of ten to hundreds of nanometers, for example. In some embodiments, the gate electrode material is deposited to a thickness of 20-50 nm. However, a gate electrode material layer thickness may be above or below this exemplary range.

Metallic electrode materials may offer high conductivity, allowing the gate electrode material layer to have minimal thickness. Metallic electrode materials may also be tuned to have a desired work function difference with a variety of semiconductor materials. The gate electrode material deposited at block 115 may include any d-block transition metal (e.g., Old IUPAC Groups IIIA-IIB/New IUPAC Groups 3-12), or p-block metal (e.g., the metal side of Old IUPAC Groups IIIB/New IUPAC Group 13 through Old IUPAC Group VIB/New IUPAC Group 16). In metal alloy embodiments, the gate electrode material includes significant amounts of two or more such metals (e.g., in the form of a binary alloy or ternary alloy). The alloys may be any linear combination of the constituents. For example, a binary alloy $M1_y M2_{1-y}$ may include any atomic percent of a first metal (M1) and a complementary atomic percent of a second metal (M2), or metalloid/non-metal. A ternary alloy $M1_y M2_z M3_{1-y-z}$, may include any atomic percent of metal M1, any atomic percent of metal M2, and a complementary atomic percent of a third metal (M3), or metalloid/non-metal such that y and z are both greater than 0, but sum to less than 1. Exemplary non-metals that may be included in a metallic compound include, but are not limited to, nitrogen (with the resulting metallic compound being a metal nitride) or oxygen (with the resulting metallic compound being a conductive metal oxide). Suitable metalloids include, but are not limited to, silicon (with the resulting metallic compound being a silicide), or germanium (with the resulting metallic compound being a germanide). Other metallic compounds including multiple non-metals and/or metalloids are also possible (e.g., metal oxynitrides, metal silicates, etc.).

As denoted in FIG. 1 by the dashed arrows, methods 101 may iterate through blocks 110 and 115 any number of times (e.g., 1, 5, 10, 30, or more), building up the material stack to include any number of gate electrode material layers (e.g., 1, 5, 10, 30, or more). For each iteration, another gate electrode material layer is deposited over a dielectric material layer that electrically insulates the additional gate electrode material layer from an underlying gate electrode material layer. In the last iteration, methods 101 progress from block 110 to block 120 (dashed line) so that the uppermost layer of the material stack is dielectric material.

After building up the material stack to include a desired number of gate electrode material layers, methods 101 continue at block 120 where sidewalls of the gate electrode material layer(s) and dielectric material layer(s) are exposed by patterning a feature into the material stack. The patterning process may be according to any technique(s) suitable for transistor and/or IC fabrication. In some embodiments, a masking is applied and lithographically defined into a bright field (e.g., defining islands) or dark field (e.g., defining openings) mask pattern. One or more etch processes, such as multi-step dry anisotropic etch process (e.g., one step for each gate electrode material layer, and another step for each dielectric material layer) is performed to translate the mask pattern into the layers of the material stack deposited at block 110 and block 115. Along edges of the resulting feature(s), a sidewall of each material layer is exposed. The resulting feature(s) may have any lateral dimensions that ensures an aspect ratio associated with the thicknesses of the gate electrode material layer(s) and dielectric material layer(s) is suitable for subsequently forming a semiconductor material over the material stack sidewall.

Methods 101 continue at block 130 where a sidewall of the gate electrode material layer(s) is recessed from a sidewall of the dielectric material layer(s). The recess etch may be performed with any etch process that is selective to the gate electrode material. In some embodiments, an isotropic (e.g., wet or dry) chemical etch process is performed that removes gate electrode material at a more rapid rate than at which the dielectric material is removed.

Methods 101 continue at block 140 where the recess formed at block 130 is at least partially backfilled by selectively depositing gate dielectric material onto the exposed sidewall of the gate electrode material. With selective deposition, gate dielectric material is deposited onto the sidewall of the gate electrode material more rapidly than onto a sidewall of the dielectric material layer(s). Since the gate electrode material sidewall was recessed, the selectively deposited gate dielectric may then advantageously occupy the recess without altering the dimensions of the feature patterned into the dielectric material layer(s). As such, the additive nanopatterning technique employed at block 140 may not add any gate dielectric material onto regions of a transistor structure that do not benefit from such a material build-up. Selective gate dielectric material deposition in accordance with embodiments herein is therefore to be distinguished from non-selective techniques that would result in a build up of gate dielectric material on sidewalls of the dielectric material layers.

Any material suitable as a gate dielectric may be deposited at block 140. The composition of the gate dielectric material deposited may dictate whether the transistor structure is operable as FET or a Fe-FET (with multiple $V_t$ levels). In some exemplary embodiments, the gate dielectric material is a high-k material having a relative permittivity exceeding that of bulk silicon nitride ($Si_3N_4$). In some embodiments, the material deposited at block 140 is a dielectric metal oxide or other metallic compound. Metal oxide deposited at block 140 may be a suboxide ($A_2O$) monoxide (AO), binary oxide ($AO_2$), ternary oxide ($ABO_3$), or mixture thereof (e.g., where a linear mixture variable x may range between 1 and 2). The metal oxide may include one or more of the d-block or p-block metal(s) listed above, and may include an alloy of these metals and/or p-block metalloids or nonmetals. In some exemplary embodiments, the gate dielectric material deposited at block 140 comprises oxygen at least one of Al, Hf, Zn, or Zr. In Fe-FET embodiments, the gate dielectric material deposited at block 140 is a ferroelectric. Many high-k dielectric materials are ferroelectrics when crystal texture favors a particular phase. Dopants may be added to the gate dielectric material to promote such a ferroelectric crystal phase. Silicon is one example of ferroelectric phase promoting/stabilizing dopant for $HfO_x$ gate dielectric embodiments.

For some exemplary embodiments, the gate dielectric material is deposited by atomic layer deposition (ALD) as this technique can achieve thin film thickness of as little as 2-3 monolayers and may also allow for the formation of one or more ferroelectric phases (either as grown, or upon a post-deposition thermal anneal). The gate dielectric material may be deposited to a film thickness of less than a few tens of nanometers, for example. Selective deposition may be achieved at block 140 by practicing an area selective ALD (AS-ALD) technique in which a sidewall of the gate electrode material layer(s) is a growth surface while a sidewall of the dielectric material layer(s) is a non-growth surface. A suitable disparity in the functional groups present on the growth surface and non-growth surface can enable gate dielectric material to be directly formed on only the gate electrode material surface. Hence, through manipulation of functional surface groups, the gate electrode material layer(s) may be activated and/or the dielectric material layer(s) may be deactivated to obtain the desired selective deposition. In some deactivation/blocking embodiments, a self-assembled monolayer (SAM) is employed as a means of deactivating surfaces of the dielectric material layer(s). The SAM molecules may form a blanket monolayer that blocks all but the gate electrode material surface, so that ALD of the gate dielectric material is inhibited where the SAM is present.

SAM molecules for deactivating/passivating the dielectric material layer(s) may comprise small or long (C1-C22) alkyl chains or fluorinated chains, and a head group that attaches preferentially to dielectric surfaces. In some embodiments, the head group comprises a silane, such as, but not limited to, an alkoxysilane, aminosilane, chlorosilane or a cyclic azasiliane. In one exemplary embodiment, the SAM is octadecyl trichlorosilane. In another exemplary embodiment, the SAM is trimethoxy(octadecyl)silane. In another exemplary embodiment, the SAM is triethoxy(3,3,4,4,5,5,6,6,7,7,8,8,9,9,10,10,10-heptadecafluorodecyl. In another exemplary embodiment, the SAM is 1-(3,3,4,4,5,5,6,6,7,7,8,8,9,9,10,10,10-heptadecafluorodecyl)-N,N,N',N',N'',N''-hexamethylsilanetriamine.

If the selectivity of SAM attachment (deactivation/passivation) is insufficient, for example due to reactivity of the SAM with both the gate electrode material surface and the dielectric material surface, a thermal annealing (e.g., 450° C. for 30 min), and/or a wet chemical clean/etch (e.g., 50:1 HF:H2O) may be performed following the SAM treatment to remove any SAM passivation that reacted on surfaces of the gate electrode material layer(s) while the more resilient SAM passivation that reacted on surfaces of the dielectric material layer(s) is retained. Following the deposition of the gate dielectric material, the SAM may be removed, for example by a thermal treatment of sufficient temperature (e.g., above about 450° C.), or by any wet clean/etch suitable for a particular SAM chemistry.

Methods 101 continue at block 150 where a semiconductor material is formed over a sidewall of the dielectric material layer(s), and also over the gate dielectric material that was deposited at block 140. The gate dielectric material will therefore separate the semiconductor material from a sidewall of the gate electrode material layer(s). In some examples, formation of the semiconductor material at block 150 entails a CVD or ALD deposition/growth technique to blanket deposit/grow semiconductor material over at least the exposed feature sidewall(s). The semiconductor material may be deposited to a film thickness of 20 nanometers, or less, for example.

The semiconductor material may be amorphous, or polycrystalline with or without texture as-deposited, or after a non-reactive anneal of the deposited material, for example. The semiconductor material may also have semiconducting properties as-deposited, or after a non-reactive anneal of the deposited material. Alternatively a precursor material may be first deposited and subsequently converted into semiconductor material. The semiconductor material formed at block 150 may have either p-type or n-type conductivity. The semiconductor material may comprise group IV semiconductor materials such as silicon (Si), germanium (Ge), and SiGe alloys. In other embodiments, the semiconductor material is oxide semiconductor. An oxide semiconductor is a semiconducting oxide, or a semiconductor comprising oxygen. Semiconducting properties vary with the oxide semiconductor composition and microstructure. An oxide semiconductor thin film can be amorphous (i.e., having no structural order), or polycrystalline (e.g., having micro-scale to nano-scale crystal grains). Examples of oxide semiconductors include metal oxides with a transition metal or post-transition metal (e.g. In advantageous embodiments, the semiconducting metal oxide includes at least one of Mg, Cu, Zn, Sn, Ti, Ni, Ga, In, Sb, Sr, Cr, Co, V, or Mo. Some exemplary semiconducting metal oxide embodiments include, $InO_x$, $GaO_x$, $ZnO_x$, or IGZO. In still other embodiments, the semiconductor material formed at block 160 is a semiconducting metal chalcogenide further comprising sulfur, selenium, or tellurium. Some exemplary semiconducting metal chalcogenide embodiments include $InS_x$ or $InSe_x$, $WS_x$ or $WSe_x$, $MoS_x$ or $MoSe_x$, $GaS_x$ or $GaSe_x$, $ZnS_x$ or $ZnSe_x$, $IGZS_x$ or $IGZSe_x$.

As further shown in FIG. 1, methods 101 include the fabrication of transistor terminals at block 160. A source and a drain may be fabricated so as to be electrically couple to two separate portions of the semiconductor material that are separated by an intervening portion controllable by the gate electrode material. Terminal fabrication at block 160 may be performed, at least in part, prior to practicing block 110, for example to fabricate a bottom terminal contact. Terminal fabrication at block 160 may also be performed, at least in part, subsequent to practicing block 150, for example to fabricate a top terminal contact. Terminal fabrication may be according to a variety of FET source/drain contact architectures, or according to a variety of memory array circuitry (e.g., bitline) architectures. Methods 101 end at block 170 with IC die interconnection, for example to couple terminals of multiple vertical channel thin film transistors into circuitry. In some such embodiments, one or more metallization levels are fabricated to interconnect BEOL vertical channeled, thin film transistor circuitry with FEOL CMOS circuitry.

Figure 2:
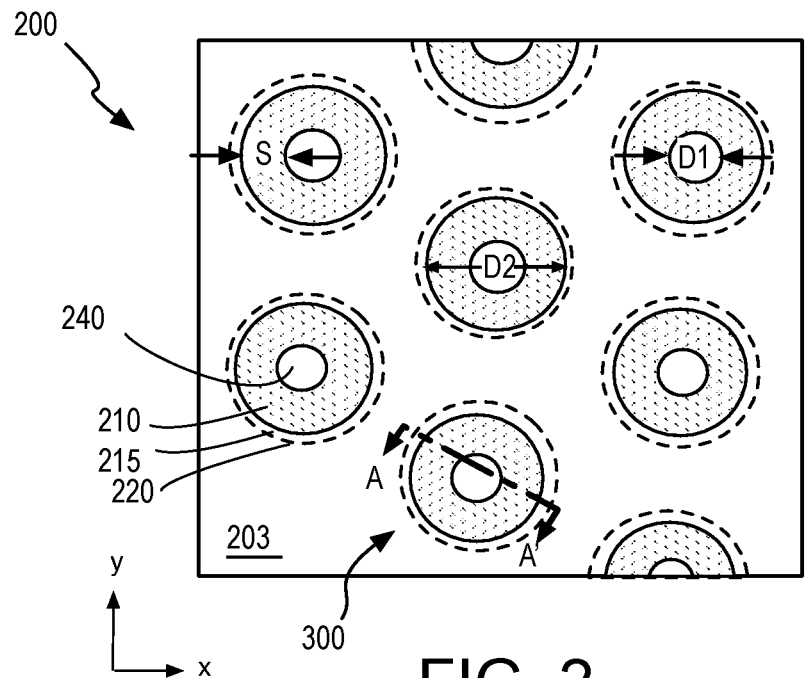
FIG. 2 is a plan view of vertical thin film transistor structures, in accordance with some embodiments.

FIG. 2 is a plan view of a vertical thin film transistor array portion 200, in accordance with some embodiments. Transistor array portion 200 may be fabricated in accordance with methods 101, for example. Transistor structure array portion 200 may be one portion of an array that extends over an area of a device layer within an IC die, for example. As shown in solid line, within the plane of a dielectric material 203, each transistor structure 300 includes a semiconductor material 210 that lines a sidewall of an opening, or via extending through dielectric material 203. In this example, a thickness of semiconductor material S is less than half the via diameter D2 so that semiconductor material 210 is a cylindrical structure. Transistor structure 300 includes additional terminals (not depicted) above and below the plane of gate electrode material 220. During operation, these terminals are electrically coupled together through semiconductor material 210 as a function of the field effect through gate dielectric material 315 responsive to a gate bias applied to gate electrode material 220.

A dielectric material 240 having a diameter D1 is surrounded by semiconductor material 210. Dielectric material 240 may have any composition (e.g., silicon dioxide, a low-k material, etc.). Dielectric material 240 may have the same composition as dielectric material 203, or not. Below the plane of dielectric material 203 is a gate dielectric material 215 that is in contact with a sidewall of a gate electrode material 220. In FIG. 2, this interface is illustrated by dashed line. Gate dielectric material 215 is also an annular or cylindrical structure. As shown, sidewall of a gate electrode material 220 is outside of via diameter D2. Gate electrode material 220 may be continuous over a plurality of transistor structures 300. For example, in FIG. 2, gate electrode material 220 is continuous over all transistor structures 300 within array portion 200. Alternatively, gate electrode material 220 may be further patterned into separate array row/column lines, or into transistor-level independent gate electrodes.

Figure 3:
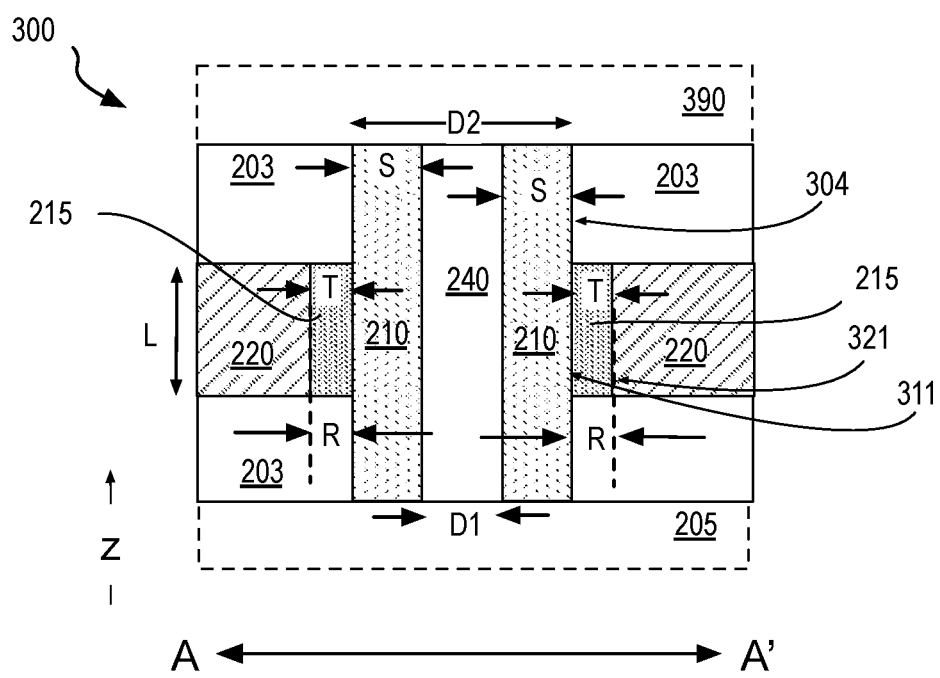
FIG. 3 is a cross sectional view of a vertical thin film transistor structure along the A-A' line shown in FIG. 2, in accordance with some embodiments.

FIG. 3 is a cross sectional view of a vertical thin film transistor structure 300 along the A-A' line shown in FIG. 2, in accordance with some embodiments. In FIG. 3, transistor structure 300 is over a substrate 205, which is illustrated in dashed line to emphasize that substrate 205 may include number of underlying gate electrode material levels and/or FEOL circuitry levels. Although not depicted, substrate 205 may include, for example, a first terminal (e.g., source) contact that is electrically coupled to semiconductor material 210. Similarly, any number of additional back-end of line (BEOL) material layers 390 may be over transistor structure 300. BEOL material layers 390 may include, for example, additional gate electrode material layers, and a second terminal (e.g., drain) contact that is electrically coupled to semiconductor material 210. In the illustrated example, semiconductor material 210 is in direct contact with a sidewall 304 of each dielectric material layer 203. The dielectric material layer sidewall 304 defines a via diameter D2, which may range from ten to a hundred nanometers, for example. In some exemplary embodiments, via diameter D2 is less than 70 nm (e.g., 40 nm, 50 nm, 60 nm, etc.).

Dielectric material layers 203 may each have any of the compositions and layer thicknesses described above for methods 101 (e.g., in the context of block 110). In some exemplary embodiments, dielectric material layers 203 both have the same composition. For example, dielectric material layers 203 may both be silicon dioxide, silicon nitride, silicon oxynitride, or any low-k material. Dielectric material layers 203 may also have different compositions (e.g., where one is silicon dioxide, and the other is a low-k material, etc.).

Semiconductor material 210 may have any of the compositions described above in the context of methods 101. In some exemplary embodiments semiconductor material 210 is polysilicon, in other exemplary embodiments semiconductor material 210 is an oxide semiconductor, such as IGZO, and in still other exemplary embodiments semiconductor material 210 is a metal chalcogenide. Semiconductor material 210 has a thickness S (as measured in a direction normal to a sidewall of dielectric material layer 203) of no more than half via diameter D2. In some embodiments where via diameter is less than 70 nm, semiconductor material 210 has a thickness S of less than 30 nm (e.g., 5 nm, 10 nm 15 nm, 20 nm, 25 nm, etc.). Dielectric material 240 may have any diameter D1 resulting from the difference between via diameter D2 and twice semiconductor material thickness S.

Transistor structure 300 further includes gate electrode material 220, which is between dielectric material layers 203. Gate electrode material 220 may have any of the compositions described above in methods 101 (in the context of block 115), for example. Gate electrode material 220 may include an elemental metal layer, a metal alloy layer, or laminate structure of either, or both. In some embodiments, gate electrode material 220 is a metal nitride, such as TiN. The gate electrode may also comprise Al (e.g., TiAlN). Other alloy constituents may also be present in gate electrode material 220, such as, but not limited to C, Ta, W, Pt, Zn, or Sn. Gate electrode material 220 has a sidewall 321 recessed from sidewall 304 by a recess radial distance R that spans a distance between gate electrode material sidewall 321, and via diameter D2. Radial distance R may vary from a few nanometers to tens of nanometers. In some examples, radial distance R is between 5 nm and 15 nm (e.g., 10 nm).

Semiconductor material 210 is spaced apart from gate electrode material sidewall 321 by gate dielectric material 215, which at least partially occupies the recess of radial distance R. Gate dielectric material 215 may have any of the compositions describe above for methods 101 (in the context of block 140), for example. In some embodiments, gate dielectric material 215 is a ferroelectric material. Exemplary ferroelectric materials include dielectric metal oxides, such as, but not limited to, $AlO_x$, $HfO_x$, $HfAlO_x$. The ferroelectric material may further comprise silicon (e.g., is a silicate), with one example being $HfSiO_x$.

In some embodiments, gate dielectric material 215 is a cylindrical structure between the semiconductor material and a sidewall of gate electrode material layer 220. In the illustrated example, gate dielectric material 215 is in direct contact with gate electrode material sidewall 321, and gate dielectric material 215 has a thickness T (as measured in a direction normal to a sidewall of gate electrode material sidewall 321). In the illustrated embodiment, gate dielectric material 215 thickness T is substantially equal to radial distance R so that a semiconductor channel interface 311 between semiconductor material 210 and gate electrode material 220 is substantially equal to via diameter D2. While gate dielectric material 215 thickness T may deviate from radial distance R (e.g., by 1-5 nm), a greater consistency of via diameter D2 between dielectric material layers 203 and gate electrode material 220 may reduce undulations in the via sidewall, and reduce variations in the semiconductor material thickness S within the channel portion (having length L associated with a thickness of gate electrode material layer 220).

Notably, gate dielectric material 215 is localized to between gate electrode material 220 and semiconductor material 210 within the channel portion of transistor structure 300. Hence, gate dielectric material 215 has thickness T adjacent to gate electrode material sidewall 321, but there is a lesser thickness of gate dielectric material 215 between dielectric material sidewall 304 and semiconductor material 210. In the illustrated example, there is no appreciable thickness of gate dielectric material 215 between dielectric material sidewall 304 and semiconductor material 210. Such localization of the gate dielectric material 215 is indicative of a selective deposition of gate dielectric material 215, for example in accordance with methods 101. With gate dielectric material localized, dielectric material sidewall 304 is in direct contact with semiconductor material 210. Semiconductor material 210 therefore has an outer diameter that is substantially equal to via diameter D2 (i.e., not reduced by gate dielectric material thickness T).

Figure 4:
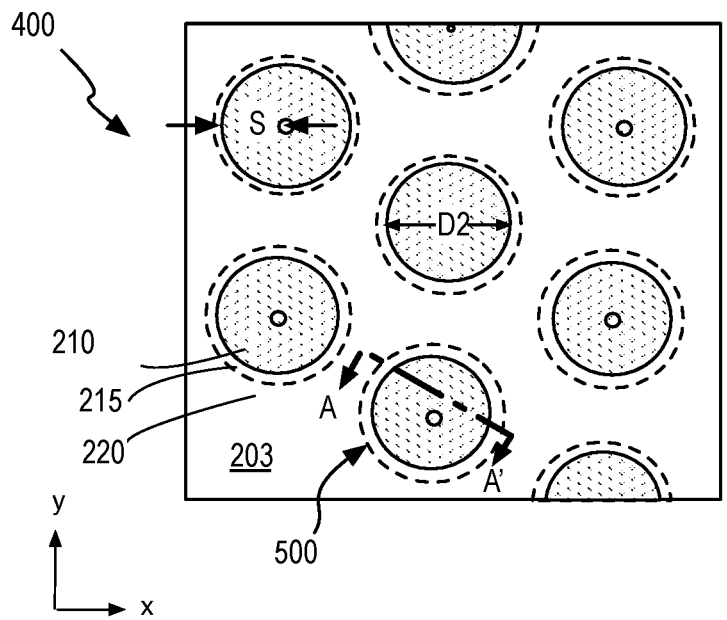
FIG. 4 is a plan view of vertical thin film transistor structures, in accordance with some embodiments.

FIG. 4 is a plan view of a vertical thin film transistor array portion 400, in accordance with some embodiments. For the sake of clarity, reference numbers from FIG. 2 are repeated in FIG. 4 where features share the same attributes (e.g., composition). In FIG. 4, transistor array portion 400 may be fabricated in accordance with methods 101, for example. Transistor array portion 400 (FIG. 4) may be one portion of an array that extends over an area of a device layer within IC die, for example. As shown in solid line, within the plane of a dielectric material 203, each transistor structure 500 includes semiconductor material 210 within a via extending through dielectric material 203. In this example, a thickness of semiconductor material S is nearly equally to a radius of the via (half the via diameter D2) so that semiconductor material 210 is forms a nearly solid plug. Transistor structure 500 therefore illustrates a dimensional shrink from transistor structure 300 (FIG. 2). FIG. 4 further illustrates in dashed line gate dielectric material 215 in direct contact with a sidewall of a gate electrode material 220. The sidewall of a gate electrode material 220 is again outside of via diameter D2.

Figure 5:
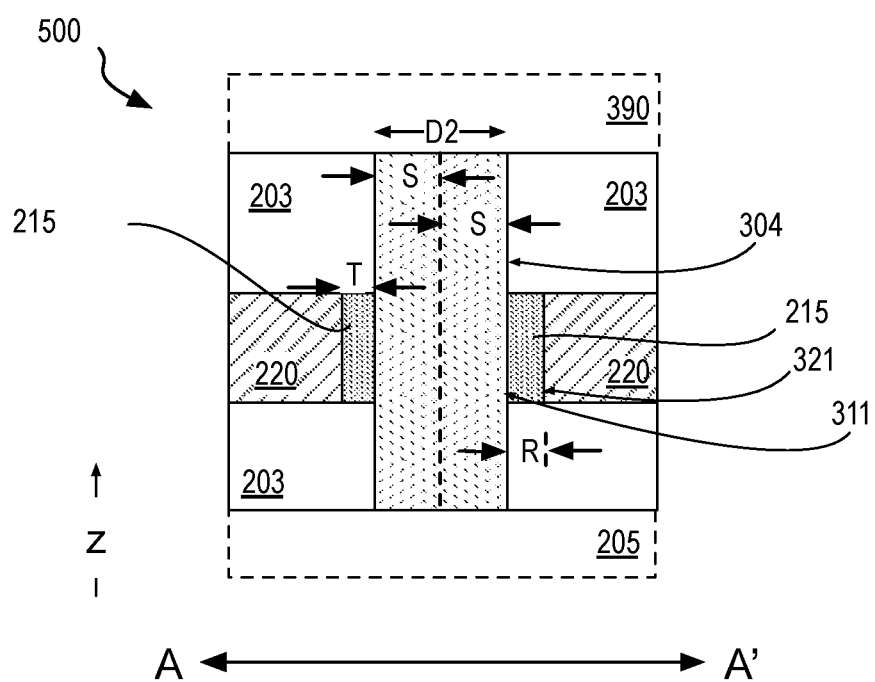
FIG. 5 is a cross sectional view of a vertical thin film transistor structure along the A-A' line shown in FIG. 4, in accordance with some embodiments.

Transistor structure 500 is another example of a vertical channeled FET or Fe-FET in which the additional terminals (not depicted) are above and below the plane of gate electrode material 220. As shown in FIG. 5, transistor structure 500 is between substrate 205 and BEOL material layers 390, each of which may again include other gate electrode material layers. For these embodiments, via diameter D2 is approximately equal to, or a few nanometers larger than, twice the semiconductor material thickness S. Thickness S may be approximately equal to a depletion depth of a channel portion of semiconductor material 220 (adjacent to gate dielectric sidewall 321), for example. In some embodiments, via diameter D2 is not more than 50 nm (e.g., 35 nm, 45 nm, etc.), and semiconductor material thickness S is not more than 25 nm (e.g., 15 nm, 20 nm, etc.).

Gate electrode material sidewall 321 is recessed from dielectric sidewall 304 over radial distance R from a center of the via. Semiconductor material 210 is spaced apart from gate electrode material sidewall 321 by gate dielectric material 215, which at least partially occupies the recess. In the illustrated example, gate dielectric material 215 has a thickness T that is substantially equal to radial distance R so that semiconductor channel interface 311 is approximate aligned with via diameter D2. As evident from the reduced via diameter D2, the absence of gate dielectric material adjacent dielectric material sidewall 304 enables semiconductor material layer 220 to maintain thickness S throughout the z-height of the illustrated material stack.

Figure 6:
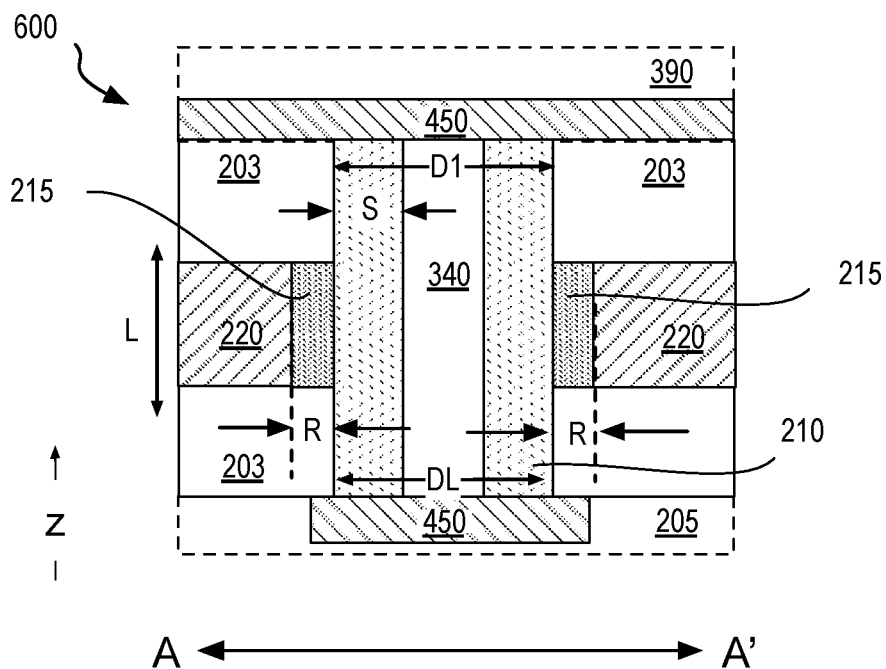
FIGS. 6 and 7 are cross sectional views of alternative vertical thin film transistor structures along the A-A' line shown in FIG. 2, in accordance with some further embodiments.

FIG. 6 is a cross sectional view of a vertical thin film transistor structure 600 along the A-A' line of FIG. 2, in accordance with some logic transistor embodiments. Transistor structure 600 further illustrates one example of source/drain contact metallization 450 above and below a plane of gate electrode material layer 220. Source and drain contact metallization 450 is in direct contact with semiconductor material 210. Proximal to source and drain metallization 450 semiconductor material 210 may comprise a higher concentration of impurity dopants (e.g., p-type or n-type conductivity) than within the intervening channel portion of semiconductor material 210. A metal silicide (not depicted) may also be present at the interface of semiconductor material 210 and source and drain contact metallization 450. Source/drain contact metallization 450 may include one or more metals that form an ohmic or tunneling junction directly to semiconductor material 210. Exemplary source and drain contact metallizations include Ti, W, Pt, their alloys, and nitrides.

Figure 7:
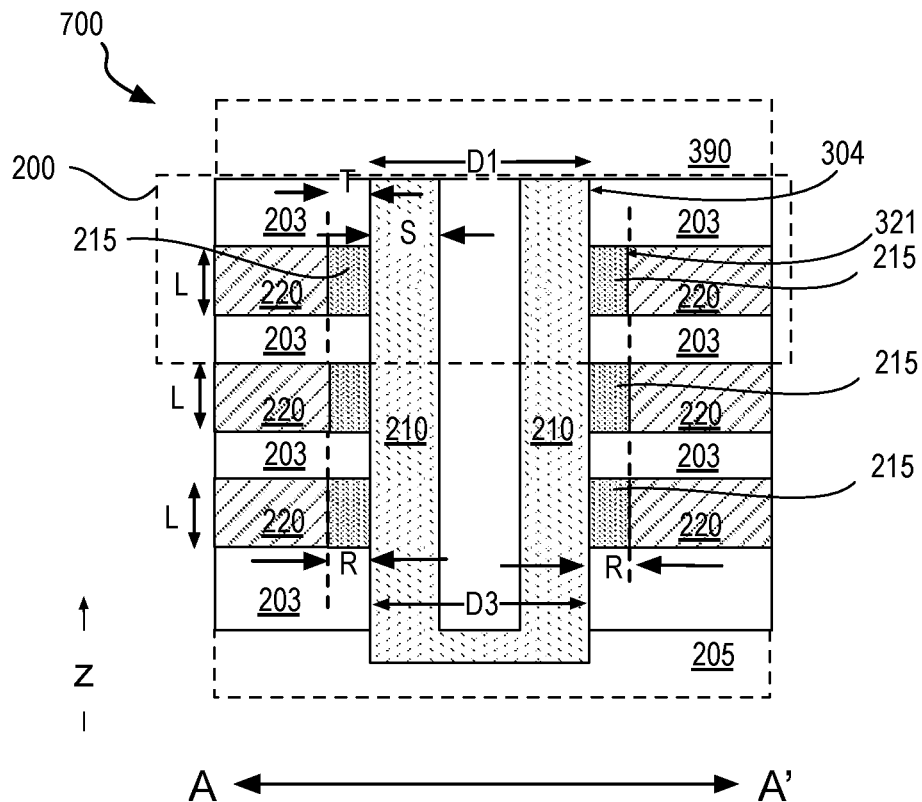

As noted above, vertical thin film transistor structures may comprise any number of gate electrode material layers. A vertical string of gate controlled semiconductor channels may be employed in a variety of memory array architectures. A vertical NAND flash memory architecture is one example where a stack of gate electrode material layers may each be operable as a control gate electrode within a string of many transistor structures. FIG. 7 is a cross sectional view of a vertical Fe-NAND flash memory device structure 700, for example along the A-A' line shown in FIG. 2, in accordance with some memory device embodiments.

Vertical Fe-NAND flash memory device structure 700 includes a plurality of vertical Fe-FET structures, each of which may have any of the features described above in the context of FIG. 2-6. For example, a subset of structure 700 corresponding to structure 200 (FIG. 2) is demarked in FIG. 7 by dashed line. In structure 700, intervening dielectric material layers 203 separate individual ones of a plurality of gate electrode material layers 220. For Fe-NAND structure 700, gate dielectric material 215 is a ferroelectric material, such as any of those described above. Gate electrode material layers 220 may each be coupled to a wordline of a NAND memory array. Semiconductor material 210 may be coupled to a bitline (not depicted) within substrate 205, and further coupled through BEOL material layers 390 to a select transistor (not depicted), for example.

As shown in FIG. 7, each gate electrode material layer 220 has a sidewall 321 recessed from dielectric material layer sidewall 304 by radial distance R. Dielectric material layer sidewall 304 defines a via extending through the vertical Fe-NAND material stack. The via has an upper diameter D1 and a lower diameter D3. Although upper and lower diameters D1, D3 are illustrated as being substantially equal, the lower via diameter D3 may instead be somewhat smaller than upper diameter D1, for example as a result of via etch taper, as the number of gate electrode material layers increases. Regardless of the amount of via profile taper, radial distance R may be substantially constant over all gate electrode material layers 220. Gate dielectric material thickness T may also be substantially constant over all gate electrode material layers 220 so that the via profile (tapered, or not) is substantially continuous over the dielectric material sidewalls. Semiconductor material 210 may therefore have a thickness S that is substantially constant over all channel portions of the vertical Fe-NAND flash memory structure. Accordingly, $V_t$ variation of each of the plurality of Fe-FETs may be reduced so that multiple $V_t$ states may be better discerned by read out circuitry.

Figure 8A:
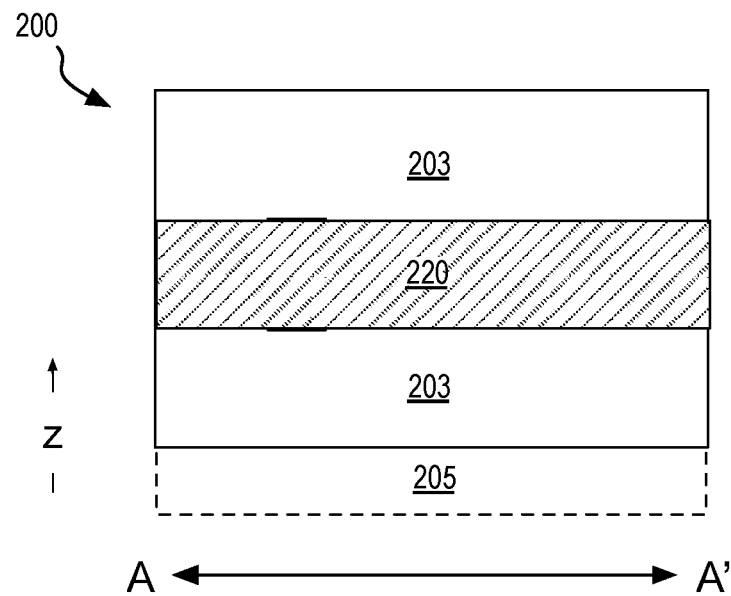
FIGS. 8A, 8B, 8C, 8D, 8E and 8F are cross-sectional views of a vertical thin film transistor structure evolving as a fabrication method is practiced, in accordance with some embodiments.
Figure 8B:
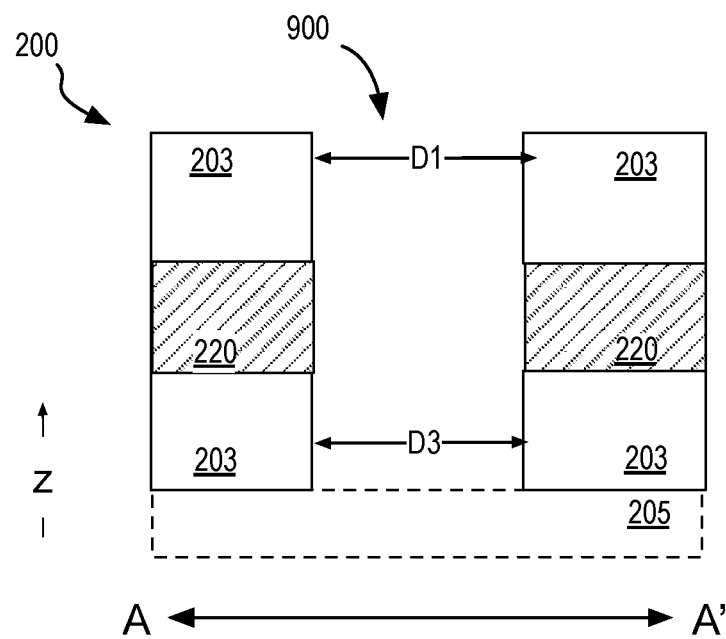

FIG. 8A-8F illustrate vertical thin film transistor structure 200 evolving as methods 101 are practiced in accordance with some embodiments. As shown in FIG. 8A, multiple iterative thin film material depositions may be practiced to generate a material stack including gate electrode material layer 220 and dielectric material layer 203. As further illustrated in FIG. 8B, the gate electrode/dielectric material stack may be patterned, for example to form access vias 900 having an upper via diameter D1 and a lower via diameter D3.

Figure 8C:
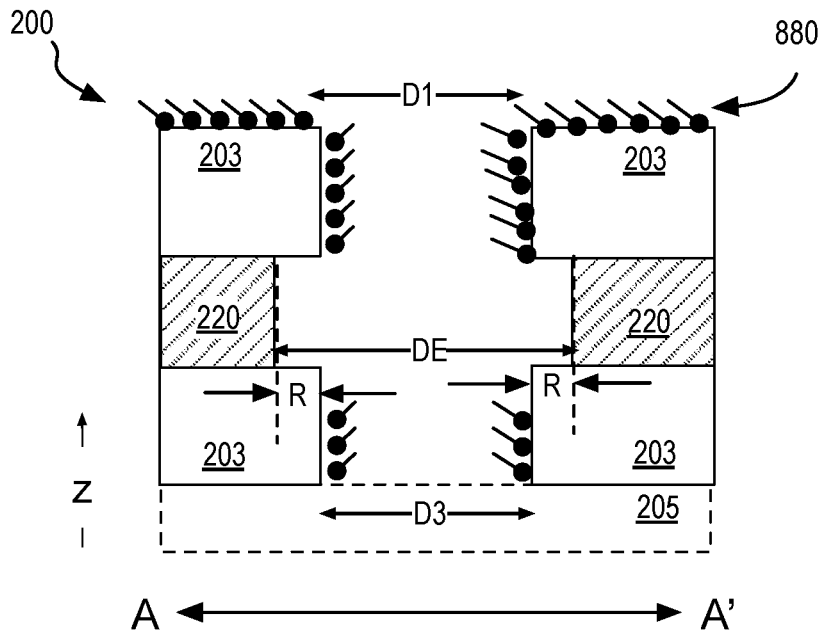
Figure 8D:
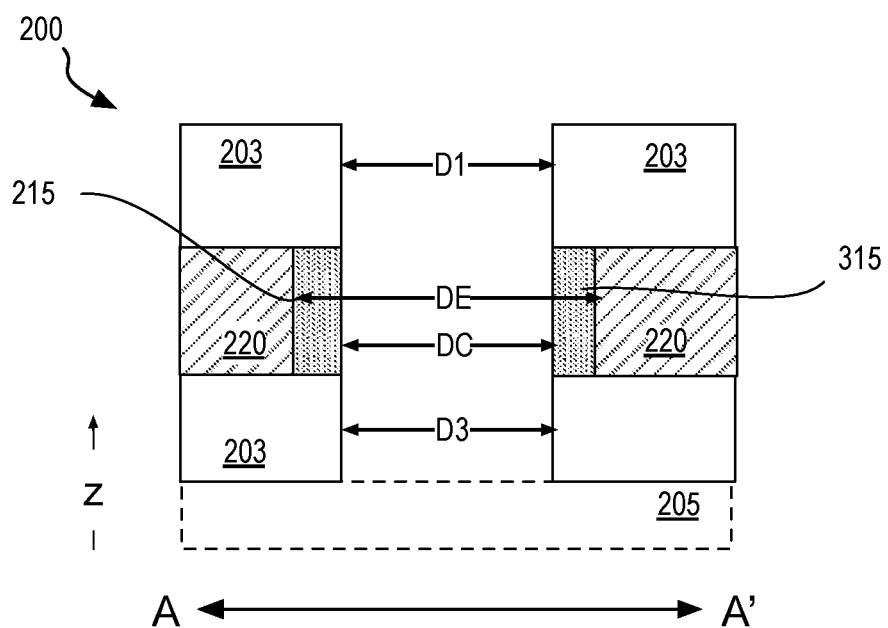

As shown in FIG. 8C, the via sidewall comprising gate electrode material 220 is recessed to an electrode diameter DE that is beyond via diameter D1 and/or D3. As further illustrated in FIG. 8C, a SAM 880 is formed selectively over (sidewall) surfaces of dielectric material layers 203. Gate dielectric material 215 (e.g., with a ferroelectric or other high-k composition/crystallinity) is deposited by ALD onto a sidewall of gate electrode material 220 while SAM 880 blocks any significant deposition of gate dielectric material 215. As shown in FIG. 8D, gate dielectric material is deposited adjacent to the gate electrode sidewall to a thickness target that will result in the via having a channel diameter DC approximately equal to via diameter D1 and/or D3.

Figure 8E:
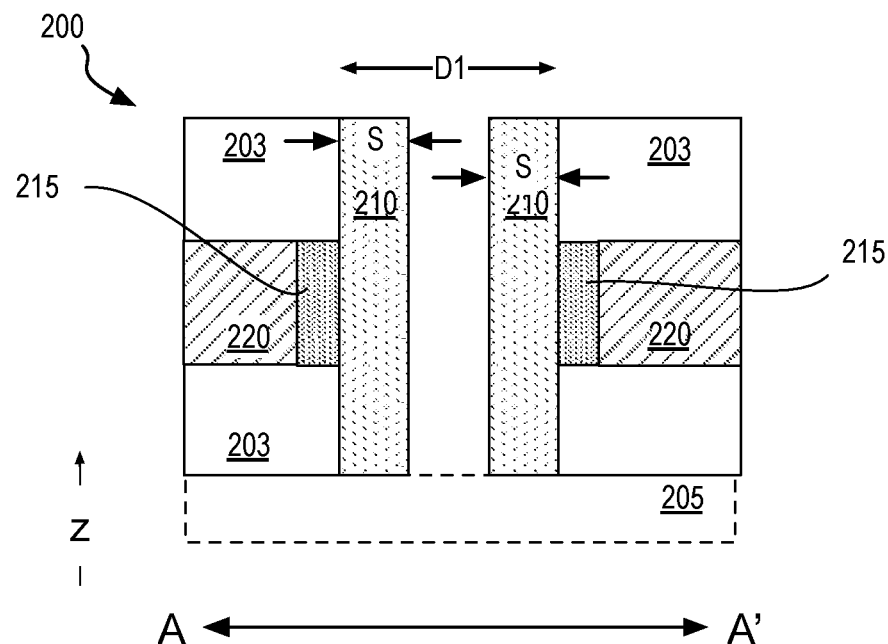
Figure 8F:
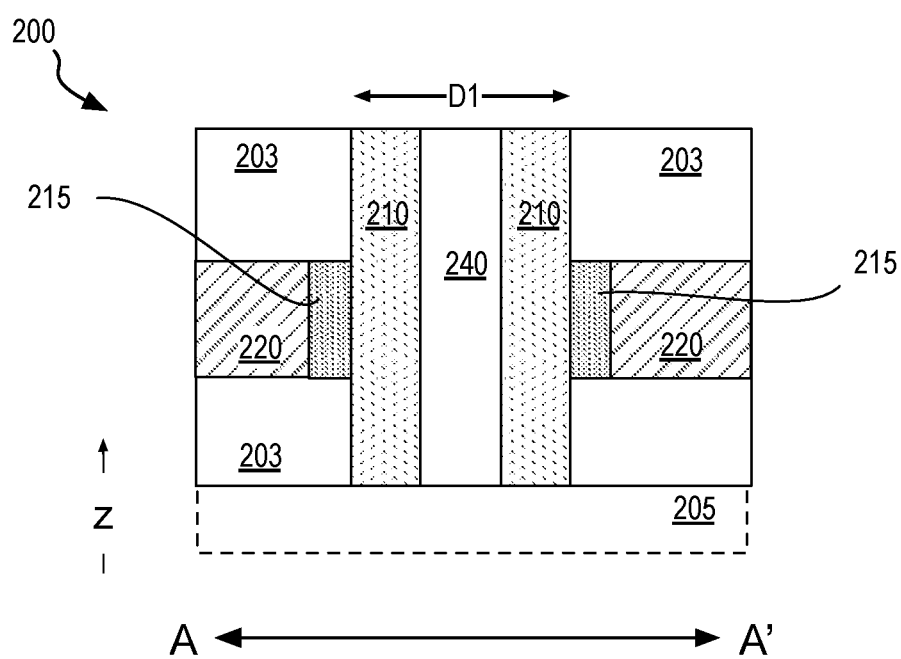

Semiconductor material 210 may then be deposited in the access vias so that semiconductor material 210 is adjacent to the gate dielectric material 215, and adjacent to a sidewall of dielectric material 203, for example as shown in FIG. 8E. Any void near the center of the access via may then be filled with dielectric material 240, as shown in FIG. 8F. Transistor structure 200 may then be planarized and additional processing performed according to any suitable techniques.

Figure 9:
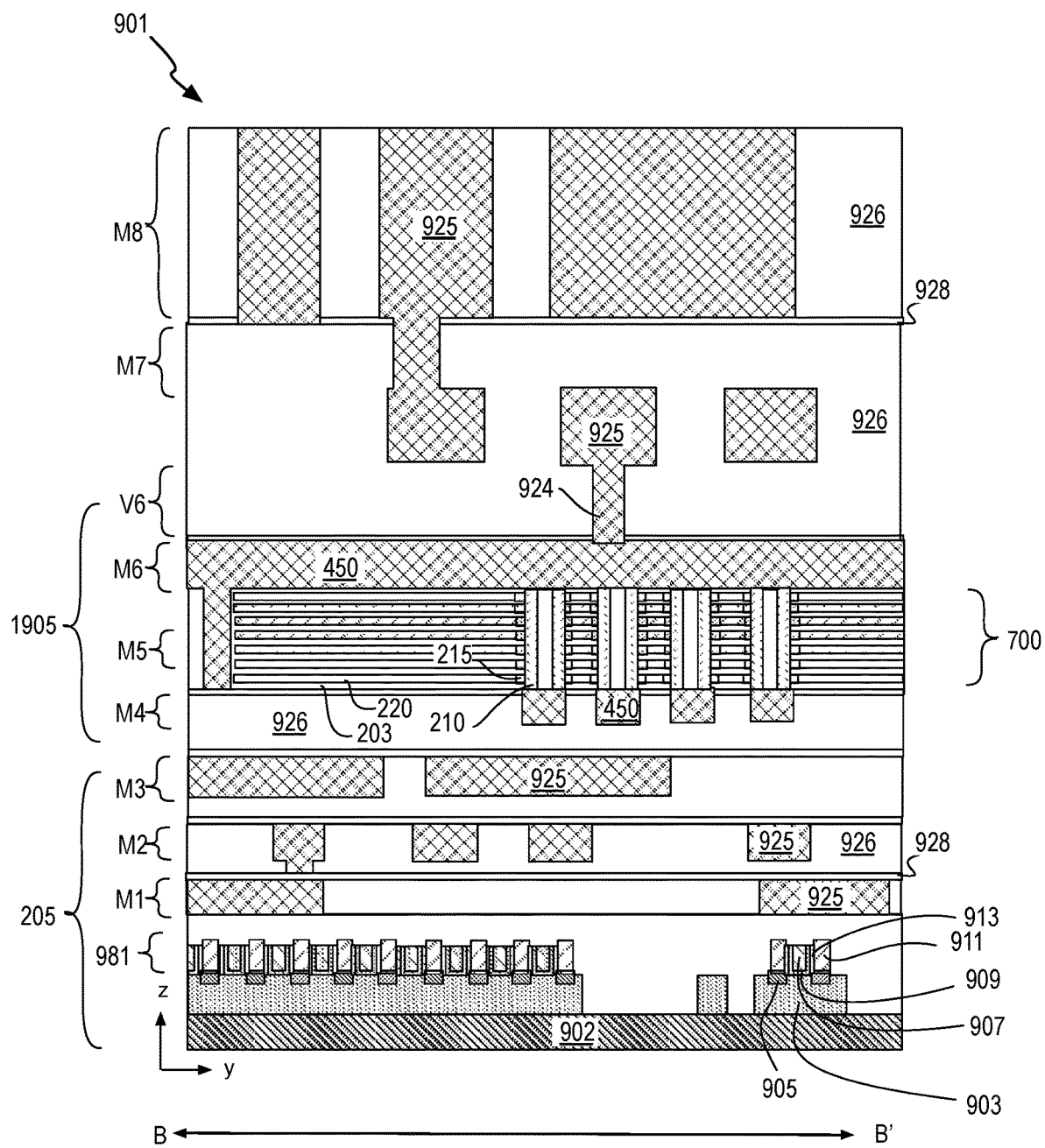
FIG. 9 illustrates a cross-sectional view of a 3D IC structure including vertical thin film transistor circuitry over CMOS FET circuitry, in accordance with some embodiments.

FIG. 9 illustrates a cross-sectional side view of a 3D IC structure 901, in accordance with some embodiments. Structure 901 illustrates a portion of a monolithic IC that includes substrate 205 that in this example comprises FEOL device circuitry fabricated over and/or on a single crystalline substrate 902. In this example, FEOL device circuitry includes a plurality of MOSFETs 981 that employ a monocrystalline semiconductor material 903 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.). FETs 981 include a gate terminal 907 separated from a semiconductor material 903 by a gate dielectric 909. The channel region of semiconductor material 903 separates semiconductor terminals 905 (source semiconductor and drain semiconductor). Contact metallization 911 is in contact with semiconductor terminals 905 and is separated from gate terminal 907 by an intervening dielectric spacer 913. Any materials known to be suitable for FETs may be present in FEOL FETs 981. FETs 981 may be planar or non-planar devices. In some advantageous embodiments, FETS 981 are finFETs. FETs 981 may include one or more semiconductor materials. As one example, semiconductor material 903 is a surface layer of a substantially monocrystalline substrate 902. Substrate 902 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 925 electrically insulated by dielectric materials 926, 928. In the exemplary embodiment illustrated, FEOL device circuitry includes metal-one (M1), metal-two (M2) and metal-three (M3) interconnect metallization levels. Interconnect metallization 925 may be any metal(s) suitable for FEOL and/or BEOL IC interconnection. Interconnect metallization 925, may be, for example, an alloy of predominantly Cu, an alloy of predominantly W, an alloy of predominantly Al, an alloy of predominantly Ru, etc. Dielectric material 926 may be any dielectric material known to be suitable for electrical isolation of monolithic ICs. In some embodiments, dielectric material 926 comprises silicon, and at least one of oxygen and nitrogen. Dielectric material 926 may be SiO, SiN, or SiON, for example. Dielectric material 926 may also be a low-K dielectric material (e.g., having a dielectric constant below that of $SiO_2$). Dielectric material 928 has a different composition than dielectric material 926, and may be of a composition that has a higher dielectric constant than that of dielectric material 926. In some examples where dielectric material 926 is predominantly silicon and oxygen (i.e., $SiO_x$), dielectric material 928 is predominantly silicon and nitrogen (i.e., $SiN_x$).

BEOL device circuitry is located over the FEOL device circuitry, with dielectric material 926 therebetween. BEOL device circuitry includes a plurality of embedded vertical NAND flash device structures 1905 that employ a plurality of vertical thin film semiconductor transistors with localized gate dielectric material. In some embodiments, vertical NAND flash device structures 1905 comprise a localized ferroelectric gate dielectric material, such as a Fe-NAND structure describe elsewhere herein. In other embodiments, BEOL device circuitry includes other types of transistors, such as logic devices employing one or more vertical transistor structures with localized gate dielectric material. For the illustrated embodiments, individual ones of devices 1905 include a plurality of gate electrode material layers 220 separated from a plurality of dielectric material layers 203. A semiconductor body 210 is in contact with gate dielectric material 215.

BEOL circuitry may comprise any number of metallization levels over transistor structures 1905, such as a metallization level (e.g., M6) immediately above the metallization level (e.g., M5) in which transistor structures 1905 reside. As further shown, a via 924 electrically connects interconnect metallization levels to select terminal contact metallization 450. Any number of interconnect metallization levels may be employed to couple BEOL circuitry to the underlying FEOL device circuitry. In the example shown in FIG. 9, metallization levels of BEOL circuitry (e.g., M8) may be routed down through any number of metallization levels (e.g., M8-M3) to be in electrical communication with one or more FEOL transistors 981. In some examples, FEOL transistors 981 comprise decoder circuitry interconnected to NAND devices 1905.

Figure 10:
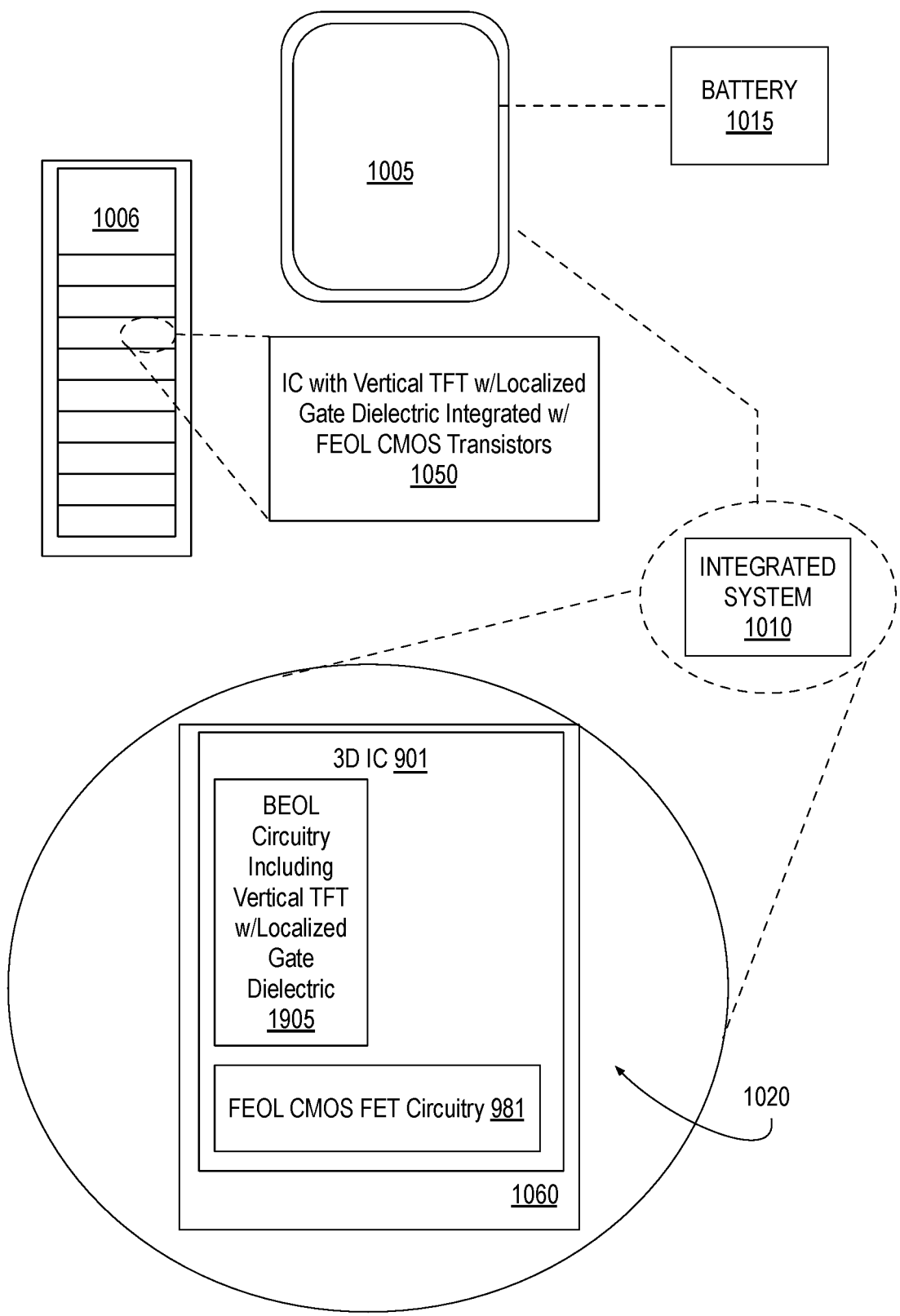
FIG. 10 illustrates a system employing an IC including vertical thin film transistor circuitry over CMOS FET circuitry, in accordance with some embodiments.

FIG. 10 illustrates a system in which a mobile computing platform 1005 and/or a data server machine 1006 employs an IC including at least one TFT with localized gate dielectric material, such as a Fe-NAND memory structure describe elsewhere herein. The server machine 1006 may be any commercial server, for example including any number of high-performance computing platforms disposed within a rack and networked together for electronic data processing, which in the exemplary embodiment includes 3D IC 901. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010 and a battery 1015.

Whether disposed within the integrated system 1010 illustrated in the expanded view 1020, or as a stand-alone packaged chip within the server machine 1006, packaged monolithic 3D IC 1050 includes a memory chip (e.g., RAM), or a processor chip (e.g., a microprocessor, a multi-core microprocessor, graphics processor, or the like) including at least one vertical thin film transistor with localized gate dielectric material, such as a Fe-NAND flash memory structure describe elsewhere herein. 3D IC 1050 may further include silicon CMOS front-end circuitry 981. The monolithic IC 1050 may be further coupled to a board, a substrate, or an interposer 1060.

3D IC 901 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the 3D IC 901 or within a single IC coupled to the package substrate of the 3D IC 901.

Figure 11:
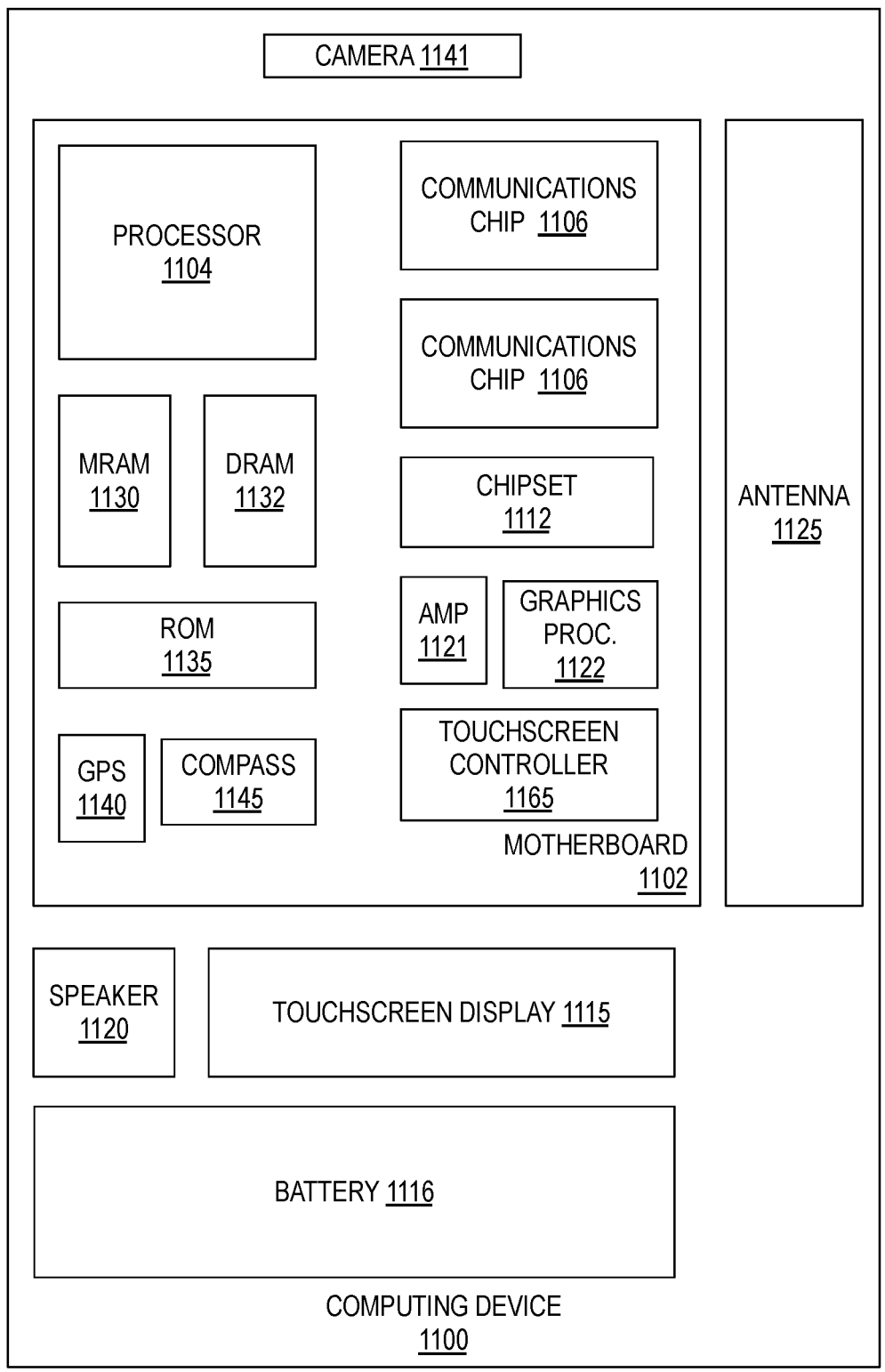
FIG. 11 is a functional block diagram illustrating an electronic computing device, in accordance with an embodiment of the present invention.

FIG. 11 is a functional block diagram of an electronic computing device 1100, in accordance with some embodiments. Device 1100 further includes a motherboard 1102 hosting a number of components, such as, but not limited to, a processor 1104 (e.g., an applications processor). Processor 1104 may be physically and/or electrically coupled to motherboard 1102. In some examples, processor 1104 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM 1132), non-volatile memory (e.g., ROM 1135), flash memory (e.g., Fe-NAND), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a vertical transistor structure comprises a material layer stack comprising a first dielectric material layer, a second dielectric material layer, and a gate electrode material layer therebetween. A semiconductor material is in direct contact with a sidewall of both the first and second dielectric material layers. A gate dielectric material is between the semiconductor material and a sidewall of the gate electrode material layer. The gate dielectric material has a higher relative permittivity than the first and second dielectric material layers. First and second terminal contacts are coupled to the semiconductor material on opposite sides of the gate electrode.

In second examples, in the vertical transistor structure of the first examples the gate electrode material layer comprises a metal, a sidewall of the gate electrode material layer is recessed laterally from the sidewall of both the first and second dielectric material layers, the semiconductor material is in contact with the gate dielectric material, and the gate dielectric material is between the first and second dielectric materials.

In third examples, for any of the first through second examples the gate dielectric material comprises a ferroelectric material.

In fourth examples, for any of the first through third examples the gate dielectric material comprises oxygen and at least one of Hf, Al, Zn, or Zr.

In fifth examples, for any of the second through fourth examples a thickness of the gate dielectric material is no greater than the amount by which the sidewall of the gate electrode material layer is recessed laterally from the sidewall of both the first and second dielectric material layers.

In sixth examples, for any of the second through the second examples an interface between the gate dielectric and the semiconductor material is within 5 nm of the sidewall of both the first and second dielectric material layers.

In seventh examples, for any of the second through sixth examples, the semiconductor material is within a via extending through the material layer stack, the via having an upper diameter defined by the sidewall of the second dielectric material layer, and a lower diameter defined by the sidewall of the first dielectric material layer. The gate dielectric material is a cylindrical structure that surrounds a channel portion of the semiconductor material, the cylindrical structure having an outer diameter that is larger than at least one of the upper and lower diameters. The gate electrode material layer surrounds the cylindrical structure.

In eighth examples, for any of the seventh examples, the cylindrical structure has an inner diameter that is at least as large as the lower diameter of the via.

In ninth examples, for any of the first through eighth examples the material stack further comprises a plurality of gate electrode material layers, each gate electrode material layer separated from another by a dielectric material layer. The semiconductor material is in direct contact with a sidewall of each of the dielectric material layers. A plurality of cylindrical structures comprises the gate dielectric material, each of the cylindrical structures being between the semiconductor material and a sidewall of one of the gate electrode material layers. The plurality of gate electrode material layers are between the first contact metal and the second contact metal.

In tenth examples, for any of the ninth examples the gate dielectric material is in direct contact with a sidewall of each of the gate electrode material layers, and the semiconductor material is in direct contact with the gate dielectric material.

In eleventh examples, for any of the ninth through tenth examples, the semiconductor material is within a via extending through the material layer stack, the via having an upper diameter associated with the sidewall of the second dielectric material layer, and a lower diameter associated with the sidewall of the first dielectric material layer. Each of the cylindrical structures surrounds a channel portion of the semiconductor material, each of the cylindrical structures having an outer diameter that is larger than at least one of the upper and lower diameters. Each of the gate electrode material layers surrounds one of the annular structures.

In twelfth examples, for any of the eleventh examples, the upper diameter is no more than 50 nm, the outer diameter of the cylindrical structure is not more than 15 nm greater than an inner diameter of the cylindrical structure, and the semiconductor material has a thickness of at least 5 nm.

In thirteenth examples, an integrated circuit (IC) die comprises a plurality of complementary metal-oxide-semiconductor (CMOS) field effect transistor (FET) structures, wherein individual ones of the CMOS FET structures comprise a Group IV semiconductor material. The IC comprises a plurality of back-end transistor structures over the CMOS FET structures, with one or more levels of interconnect metallization therebetween, wherein individual ones of the back-end transistor structures comprise the vertical transistor structure of any of the first through twelfth examples.

In fourteenth examples, a vertical Fe-NAND memory structure comprises a material stack comprising a plurality of gate electrode material layers, each gate electrode material layer separated from another by a dielectric material layer. The structure comprises a via extending through the material layer stack, the via having an upper diameter defined by sidewall of the second dielectric material layer, a lower diameter defined by a sidewall of the first dielectric material layer, and a plurality of expanded diameters, wherein each of the expanded diameters is defined by a sidewall of one the gate electrode material layers, and the expanded diameter is larger than at least one of the lower and upper diameters. The structure comprises a plurality of cylindrical structures, each comprising a ferroelectric gate dielectric material, wherein an outer sidewall of individual ones of the cylindrical structures is in direct contact with a sidewall of individual ones of the gate electrode material layers, and wherein an inner diameter of individual ones of the cylindrical structures is no smaller than the lower diameter. The structure comprises a semiconductor material in direct contact with the sidewalls of the first and second dielectric material layers, and in direct contact with an inner sidewall of individual ones of the cylindrical structures.

In fifteenth examples, for the vertical Fe-NAND structure in any of the fourteenth examples the plurality of gate electrode material layers are coupled to wordlines.

In sixteenth examples, for any of the fourteenth through fifteenth examples the gate dielectric material comprises oxygen and at least one of Hf, Al, Zn, or Zr.

In seventeenth examples, a method of forming a vertical transistor structure comprises depositing a material stack, the material layer stack comprising a first dielectric material layer, a second dielectric material layer, and a gate electrode material layer therebetween. The method comprises forming an opening through the material stack, the opening exposing a sidewall of each of the first dielectric material layer, the second dielectric material layer, and the gate electrode material layer. The method comprises recessing the sidewall of the gate electrode material layer relative to the sidewalls of the first dielectric material layer and the second dielectric material layer. The method comprises selectively depositing a gate dielectric material on the sidewall of the gate electrode material layer after the recessing. The method comprises depositing a semiconductor material onto a sidewall of the first and second dielectric material layers, and over the gate dielectric material. The method comprises forming a source contact metal and a drain contact metal coupled to the semiconductor material.

In eighteenth examples, for any of the seventeenth examples selectively depositing the gate dielectric material further comprises forming a self-assembled monolayer (SAM) on the sidewall of the first dielectric material and the sidewall of the second dielectric material, depositing the gate dielectric material over the sidewall of the gate electrode material layer, and removing the SAM from the sidewall of the first dielectric material and the sidewall of the second dielectric material.

In nineteenth examples, for any of the seventeenth through eighteenth examples the SAM comprises a plurality of molecules, individual ones of the molecules comprising a molecular chain attached to a head group, the head group comprising a silane.

In twentieth examples, for any of the seventeenth through nineteenth examples depositing the gate dielectric material further comprises an atomic layer deposition of a ferroelectric material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A vertical transistor structure, comprising:
   a material layer stack comprising a first dielectric material layer, a second dielectric material layer, and a gate electrode material layer therebetween;
   a semiconductor material in direct contact with a sidewall of both the first and second dielectric material layers, wherein the semiconductor material is within a via extending through the material layer stack, the via having a lower diameter associated with the sidewall of the first dielectric material layer, and an upper diameter associated with the sidewall of the second dielectric material layer, and wherein a thickness of the semiconductor material, in a direction normal to the sidewall of the second dielectric material, is less than half of the upper diameter;
   a gate dielectric material between the semiconductor material and a sidewall of the gate electrode material layer, wherein the gate dielectric material has a higher relative permittivity than the first and second dielectric material layers; and
   first and second terminal contacts coupled to the semiconductor material on opposite sides of the gate electrode, wherein:
      a sidewall of the gate electrode material layer is recessed laterally from the sidewall of both the first and second dielectric material layers;
      the semiconductor material is in contact with the gate dielectric material;

the gate dielectric material is between the first and second dielectric materials; and a thickness of the gate dielectric material is no greater than an amount by which the sidewall of the gate electrode material layer is recessed laterally from the sidewall of the second dielectric material layer.

2. The vertical transistor structure of claim 1, wherein: the gate electrode material layer comprises a metal.

3. The vertical transistor structure of claim 1, wherein the gate dielectric material comprises a ferroelectric material.

4. The vertical transistor structure of claim 3, wherein the gate dielectric material comprises O and at least one of Hf, Al, Zn, or Zr.

5. The vertical transistor structure of claim 1, wherein an interface between the gate dielectric and the semiconductor material is within 5 nm of the sidewall of both the first and second dielectric material layers.

6. The vertical transistor structure of claim 1, wherein:
the semiconductor material is within a via extending through the material layer stack, the via having an upper diameter defined by the sidewall of the second dielectric material layer, and a lower diameter defined by the sidewall of the first dielectric material layer;
the gate dielectric material is a cylindrical structure that surrounds a channel portion of the semiconductor material, the cylindrical structure having an outer diameter that is larger than at least one of the upper and lower diameters; and
the gate electrode material layer surrounds the cylindrical structure.

7. The vertical transistor structure of claim 6, wherein the cylindrical structure has an inner diameter that is at least as large as the lower diameter of the via.

8. The vertical transistor structure of claim 6, wherein the gate dielectric material is in direct contact with a sidewall of each of the gate electrode material layers, and the semiconductor material is in direct contact with the gate dielectric material.

9. The vertical transistor structure of claim 6, wherein:
the semiconductor material is within a via extending through the material layer stack, the via having an upper diameter associated with the sidewall of the second dielectric material layer, and a lower diameter associated with the sidewall of the first dielectric material layer;
each of the cylindrical structures surrounds a channel portion of the semiconductor material, each of the cylindrical structures having an outer diameter that is larger than at least one of the upper and lower diameters; and
each of the gate electrode material layers surrounds one of the cylindrical structures.

10. The vertical transistor structure of claim 9, wherein:
the upper diameter is no more than 50 nm;
the outer diameter of the cylindrical structure is not more than 15 nm greater than an inner diameter of the cylindrical structure; and
the semiconductor material has a thickness of at least 5 nm.

11. The vertical transistor structure of claim 1, wherein:
the material stack further comprises a plurality of gate electrode material layers, each gate electrode material layer separated from another by a dielectric material layer;

the semiconductor material is in direct contact with a sidewall of each of the dielectric material layers;
a plurality of cylindrical structures comprises the gate dielectric material, each of the cylindrical structures being between the semiconductor material and a sidewall of one of the gate electrode material layers; and
the plurality of gate electrode material layers are between the first and second terminal contacts.

12. An integrated circuit (IC) die, comprising:
a plurality of complementary metal-oxide-semiconductor (CMOS) field effect transistor (FET) structures, wherein individual ones of the CMOS FET structures comprise a Group IV semiconductor material;
a plurality of back-end transistor structures over the CMOS FET structures, with one or more levels of interconnect metallization therebetween, wherein individual ones of the back-end transistor structures comprise the vertical transistor structure of claim 1.

13. The vertical transistor structure of claim 1, further comprising a dielectric material within the via, wherein the semiconductor material is a cylindrical structure and the dielectric material within the via is surrounded by the semiconductor material.

14. A vertical Fe-NAND memory structure, comprising:
a material stack comprising a plurality of gate electrode material layers, each gate electrode material layer separated from another by a dielectric material layer;
a via extending through the material layer stack, the via having a lower diameter defined by a sidewall of a first dielectric material layer, an upper diameter defined by a sidewall of a second dielectric material layer, and a plurality of expanded diameters, wherein each of the expanded diameters is defined by a sidewall of one the gate electrode material layers, and the expanded diameter is larger than at least one of the lower and upper diameters;
a plurality of cylindrical structures, each comprising a ferroelectric gate dielectric material, wherein an outer sidewall of individual ones of the cylindrical structures is in direct contact with a sidewall of individual ones of the gate electrode material layers, and wherein an inner diameter of individual ones of the cylindrical structures is no smaller than the lower diameter; and
a semiconductor material within the via in direct contact with the sidewalls of the first and second dielectric material layers, and in direct contact with an inner sidewall of individual ones of the cylindrical structure, wherein a thickness of the semiconductor material, in a direction normal from the sidewall of the second dielectric material, is less than half of the upper diameter.

15. The vertical Fe-NAND memory structure of claim 14, wherein the plurality of gate electrode material layers are coupled to wordlines.

16. The vertical Fe-NAND memory structure of claim 15, wherein the gate dielectric material comprises O and at least one of Hf, Al, Zn, or Zr.

17. The vertical Fe-NAND memory structure of claim 14, further comprising a dielectric material within the via, wherein the semiconductor material is a cylindrical structure and the dielectric material within the via is surrounded by the semiconductor material.

* * * * *